(12) United States Patent
Lin et al.

(10) Patent No.: US 7,126,428 B2
(45) Date of Patent: Oct. 24, 2006

(54) RADIO FREQUENCY VARIABLE GAIN AMPLIFIER WITH LINEARITY INSENSITIVE TO GAIN

(75) Inventors: Li Lin, Saratoga, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/100,143

(22) Filed: Apr. 5, 2005
(Under 37 CFR 1.47)

(65) Prior Publication Data
US 2005/0195039 A1 Sep. 8, 2005

Related U.S. Application Data

(63) Continuation of application No. 10/456,417, filed on Jun. 6, 2003, now Pat. No. 6,888,411.

(51) Int. Cl.
*H03F 3/04* (2006.01)
(52) U.S. Cl. .................. 330/311; 330/261; 330/278
(58) Field of Classification Search .............. 330/311, 330/261, 278
See application file for complete search history.

(56) References Cited

U.S. PATENT DOCUMENTS

| | | | |
|---|---|---|---|
| 5,903,191 A | 5/1999 | Gosser | |
| 5,999,056 A | 12/1999 | Fong | |
| 6,417,737 B1 * | 7/2002 | Moloudi et al. ............ 330/301 |
| 6,437,612 B1 * | 8/2002 | Dasgupta et al. ........... 327/108 |
| 6,496,067 B1 | 12/2002 | Behzad et al. | |
| 6,542,036 B1 * | 4/2003 | Kusachi ...................... 330/298 |
| 6,563,382 B1 | 5/2003 | Yang | |
| 6,657,498 B1 * | 12/2003 | Park et al. .................. 330/285 |
| 6,831,507 B1 * | 12/2004 | Granville ....................... 330/9 |
| 6,888,410 B1 * | 5/2005 | Li .............................. 330/298 |
| 6,987,422 B1 * | 1/2006 | Vice ........................... 330/285 |

OTHER PUBLICATIONS

Hull, Christopher Dennis, *A Direct-Conversion Receiver for 900 MHZ (ISM Band) Spread-Spectrum Digital Cordless Telephone*, IEEE Journal of Solid-State Circuits, vol. 31, No. 12, Dec. 1996, 9 sheets.

Fong, Keng Leong, *Dual-Band High-Linearity Variable-Gain Low-Noise Amplifiers for Wireless Applications*, 1999 IEEE International Solid-State Circuits Conference, Digest of Technical Papers, 3 sheets.

* cited by examiner

*Primary Examiner*—Patricia Nguyen
(74) *Attorney, Agent, or Firm*—Brake Hughes PLC

(57) ABSTRACT

A multi-stage, variable gain amplifier whose linearity is relatively insensitive to variations in gain control is disclosed. The amplifier includes a primary cascoded pair of transistors for producing a primary output current from an input voltage as a function of a primary cascode control voltage. The amplifier further includes one or more secondary cascoded pairs of transistors coupled to the primary cascoded pair of transistors for producing one or more secondary output currents from the input voltage as a function of one or more secondary cascode control voltages. The output current of the RF circuit is a sum of the primary output current and the one or more secondary output currents.

22 Claims, 6 Drawing Sheets

RADIO FREQUENCY VARIABLE GAIN AMPLIFIER WITH LINEARITY INSENSITIVE TO GAIN

CROSS REFERENCE TO RELATED APPLICATION

This application is a continuation application of U.S. application Ser. No. 10/456,417, filed Jun. 6, 2003, now U.S. Pat. No. 6,888,411; and contains subject matter that is related to commonly owned U.S. Pat. No. 6,494,067, entitled "CLASS AB VOLTAGE CURRENT CONVERTER HAVING MULTIPLE TRANSCONDUCTANCE STAGES AND ITS APPLICATION TO POWER AMPLIFIERS", filed Jan. 7, 2002. The entire contents in each of the above cross-referenced application and patent are hereby incorporated by reference.

BACKGROUND

This invention generally relates to analog circuitry and more particularly relates to variable gain amplifiers.

Radio receivers, or tuners, are widely used in applications requiring the reception of electromagnetic energy. Applications can include broadcast receivers such as radio and television, set top boxes for cable television, receivers in local area networks, test and measurement equipment, radar receivers, air traffic control receivers, and microwave communication links among others. Transmission of the electromagnetic energy may be wirelined over a communication media or wireless by electromagnetic radio waves.

In a radio frequency (RF) transceiver, the received signal typically has a high dynamic range (>80 dB). In order to supply a signal of constant amplitude to a baseband section of the transceiver, a variable gain amplifier (VGA) with equivalent or better dynamic range is required. It is desirable that the VGA perform linearly over a large dynamic range while providing a desired level of gain. In addition, the VGA may also be used to control the power of the transmit signal among other things.

SUMMARY

In one aspect of the present invention a RF circuit includes a primary cascoded pair of transistors for producing a primary output current from an input voltage as a function of a primary cascode control voltage. The RF circuit further includes one or more secondary cascoded pairs of transistors coupled to the primary cascoded pair of transistors for producing one or more secondary output currents from the input voltage as a function of one or more secondary cascode control voltages. The output current of the RF circuit is a sum of the primary output current and the one or more secondary output currents.

In another aspect of the present invention an RF circuit includes a primary amplifier stage having one or more primary cascode transistors that control the generation of a primary output current in response to a primary cascode control voltage. The RF circuit further includes one or more secondary amplifier stages, coupled to the first amplifier stage, wherein each of the one or more secondary amplifier stages includes one or more secondary cascode transistors to control generation of one or more secondary output currents in response to one or more secondary cascode control voltages. In addition the output current of the RF circuit is a sum of the primary output current and the one or more secondary output currents.

In another aspect of the present invention a RF communication system includes a transmit node for transmitting an RF information signal. The transmit node includes a variable gain amplifier having a primary cascoded pair of transistors for producing a primary output current from an input voltage as a function of a primary cascode control voltage. The variable gain amplifier further includes one or more secondary cascoded pairs of transistors coupled to the primary cascoded pair of transistors for producing one or more secondary output currents from the input voltage as a function of one or more secondary cascode control voltages. The output current of the variable gain amplifier is a sum of the primary output current and the one or more secondary output currents. The RF communication system further includes a receive node for receiving the transmitted RF information signal.

BRIEF DESCRIPTION OF THE DRAWINGS

The present invention will become better understood with regard to the following description, appended claims, and accompanying drawings, in which:

DETAILED DESCRIPTION OF THE INVENTION

An exemplary embodiment of the present invention provides a variable gain amplifier (VGA) whose linearity is relatively insensitive to variations in the gain of the amplifier. Amplifier gain is equal to the product of the output impedance and the transconductance (gm) of the amplifier. In RF applications the output load is often an inductor that is often used to tune out the parasitic capacitance on the output node. The effective output impedance of the amplifier is therefore $Q^2R$ where Q is the quality factor of the inductor and R is the series resistance of the inductor. The transconductance of an amplifier is proportional to the aspect ratio (W/L) of the transistor and $V_{dsat}$ (i.e. $V_{gs}-V_t$ where $V_{gs}$ is the gain source voltage and $V_t$ is the threshold voltage).

The gain of the VGA can therefore be varied either by varying $V_{dsat}$ or by varying the effective output impedance. However, varying $V_{dsat}$ may vary the linearity of the VGA because the linearity of the VGA is dominated by the linearity of the transconductance stage. Varying the output impedance has less effect on linearity but consumes the same power level at a low gain setting as at a high gain setting. Therefore, the gain of an exemplary VGA of the present invention may, for example, be varied by varying the device aspect ratio W/L.

Figure 1:
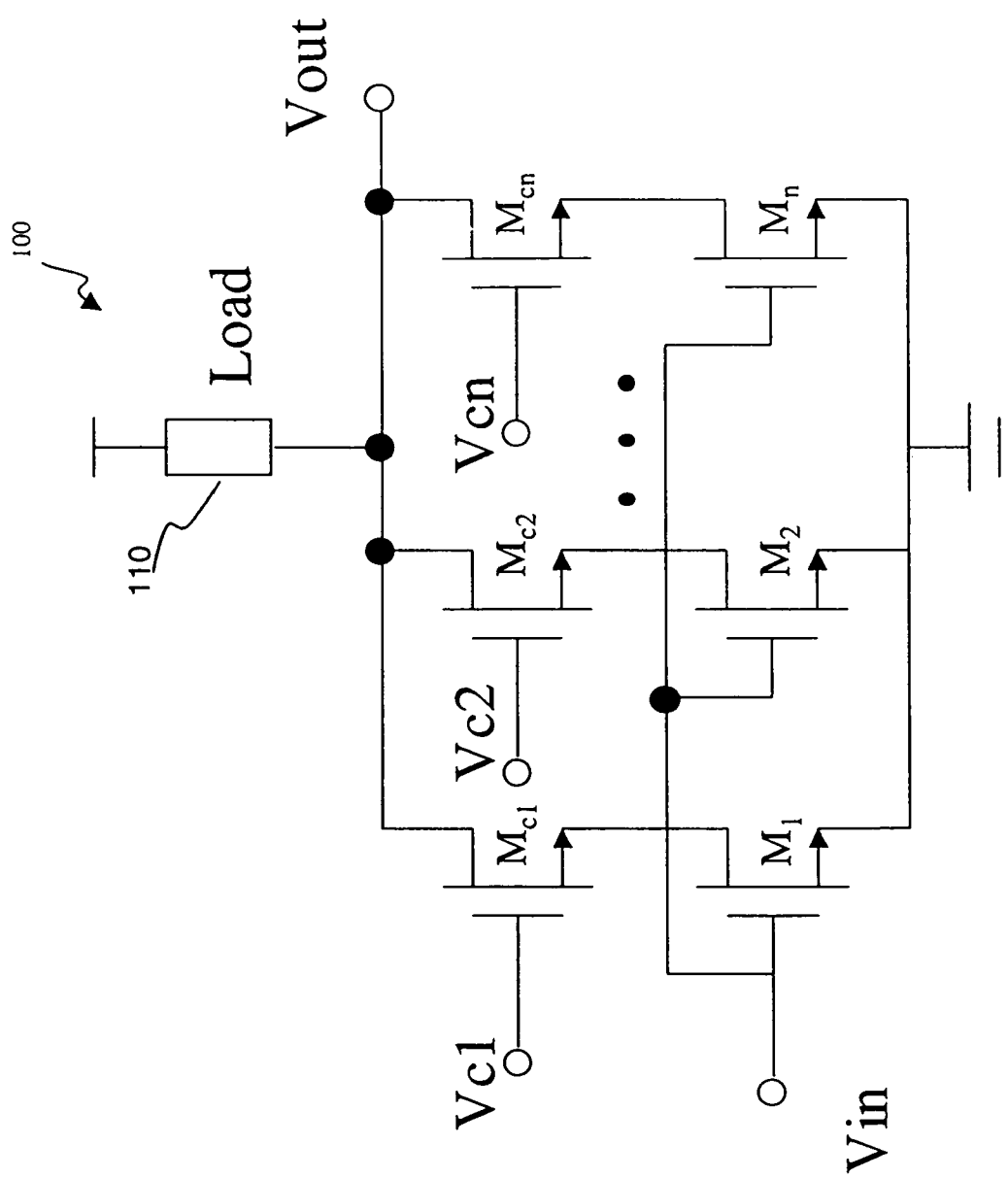
FIG. 1 is a simplified block diagram of a multi-stage variable gain amplifier comprising single ended cascoded transistor pairs wherein the cascode transistors are individually controlled to vary the gain of the amplifier in accordance with an exemplary embodiment of the present invention.

In the described exemplary embodiment secondary stages of a multi-stage amplifier may be dynamically added or subtracted to control the gain of the amplifier. For example, FIG. 1 is a simplified circuit diagram of an exemplary VGA 100 comprising, by way of example, multiple amplifier stages (1-n) coupled between a load and ground. In the described exemplary embodiment, each of the stages comprise cascoded transistor pairs. For example, in one embodiment, each of the amplifier stages may comprise NMOS FETS (e.g. $M_{c1}$ and $M_1$) serially coupled together such that the source of a cascode transistor (e.g. NMOS FET $M_{c1}$) is coupled to the drain of a transconductance transistor (e.g. NMOS FET $M_1$).

One of skill in the art will appreciate that the invention is equally applicable to single-ended or differential implementations. One of skill in the art will further appreciate that the transistors used in the amplifier stages may or may not be the same size. However, uniformity of device size reduces process, offset, and temperature variation affects in the performance of the amplifier 100. In addition, device multiplier factors (m) may be used to increase the overall device size if desired.

In the described exemplary embodiment the gates of transconductance transistors $M_1-M_n$ are coupled to an input voltage $V_{in}$ and the sources of these devices are coupled to ground. In this embodiment the gates of cascode transistors $M_{c1}-M_{cn}$ are, by way of example, individually coupled to separate cascode control voltages $V_{c1}-V_{cn}$ respectively while the drains of the cascode device are coupled to a common load 110.

In operation therefore, the cascode transistors may be individually switched on and off in accordance with the logic state (i.e. high or low) of the corresponding cascode control voltage to dynamically vary the gain of the amplifier. One of skill in the art will appreciate however, that the cascode transistors may be coupled into a plurality of groups, wherein each group of cascode transistors may be controlled by a unique one of a plurality of cascode control voltages.

For example, a multi-stage amplifier may be divided into x groups (x being an integer) where each of the x groups may contain the same or a different number of cascoded transistor pairs. In this embodiment, the gates of each cascode transistor in each group of cascoded transistor pairs may be separately coupled to a different cascode control voltage. In this embodiment therefore each of the groups of cascoded transistor pairs may be dynamically controlled by a unique cascode control voltage.

Therefore, in the described exemplary embodiment, cascode pairs of transistors can be dynamically added in parallel to obtain greater gain than can be provided by a single transistor pair. For example, in an exemplary embodiment, a processor (not shown), such as, for example, a digital signal processor (DSP) may issue commands to individually couple the cascode control voltages $V_{c1}-V_{cn}$ to a high or low logic state. Therefore, the processor can dynamically switch individual (or groups of) cascode transistors $M_{c1}-M_{cn}$ on or off thereby controlling current flow through the corresponding transconductance transistors and the overall device gain.

For example, when the amplifier is in maximum gain mode the processor issues commands to couple all of the cascode control voltages $V_{c1}, V_{c2}, \ldots V_{cn}$ to a high logic level. Therefore the cascode transistors $M_{c1}, M_{c2}, \ldots M_{cn}$ are all switched on during maximum gain operation. As a result the proper amount of current as dictated by the bias voltage on node $V_{in}$ and the sizes of transconductance transistors $M_1, M_2, \ldots, M_n$ flows through each stage of the VGA.

Similarly, the processor may reduce the overall gain of the amplifier by issuing commands to pull one or more of the cascode control voltages, $V_{c1}, V_{c2}, \ldots V_{cn}$ low. As a result one or more of the cascode transistors $M_{c1}, M_{c2}, \ldots M_{cn}$ are turned off which prevents current flow through the corresponding transconductance transistors $M_1, M_2, \ldots, M_n$ driving the gain of the turned off stage to zero.

Therefore, the gain of the individual amplifier stages can be controlled by changing the logic level (i.e. switching between high and low logic level) of the cascode control voltages. As a result, overall gain, which is equal to the sum of the gains of the conducting amplifier stages is reduced in proportion to the number of stages that were turned off.

Further, the total output current, which is equal to the sum of the output current in each stage varies in proportion to the variance in device aspect ratio, i.e. the number of conducting stages. Therefore, the gate source voltage which is proportional to the ratio of output current and device aspect ratio remains constant as a function of variation of the gain of the amplifier. As a result, the overall amplifier gain can be varied while maintaining a relatively constant transconductance (which is proportional to $V_{gs}-V_t$) for the conducting amplifier stages (i.e. stages that remain on) . Therefore, the linearity of the described exemplary amplifier, which is dominated by the linearity of the transconductance stage, is also relatively insensitive to variation in the gain of the amplifier. Further, in the described exemplary embodiment the power consumption of the amplifier is reduced as the gain is reduced.

Advantageously, the cascade transistors $M_{c1}-M_{cn}$ may further improve performance, in at least some applications, by providing better matching between the transistors in the primary amplifier stage and the transistors in the secondary amplifier stages. In addition, the cascade transistors provide isolation between amplifier stages and provide the capability to independently tune independent amplifier. The cascode transistors also reduce the Miller capacitance of the transconductance transistors.

In addition, the linearity of the described exemplary amplifier may be further improved by dynamically adding secondary amplifier stages in accordance with pre-defined offset voltages to ensure that the amplifier stages add in the proper phase as described in commonly owned U.S. Pat. No. 6,496,067, entitled "CLASS AB VOLTAGE CURRENT CONVERTER HAVING MULTIPLE TRANSCONDUCTANCE STAGES AND ITS APPLICATION TO POWER AMPLIFERS", filed Jan. 7, 2002, the contents of which are incorporated herein by reference as if set forth in full.

Figure 2:
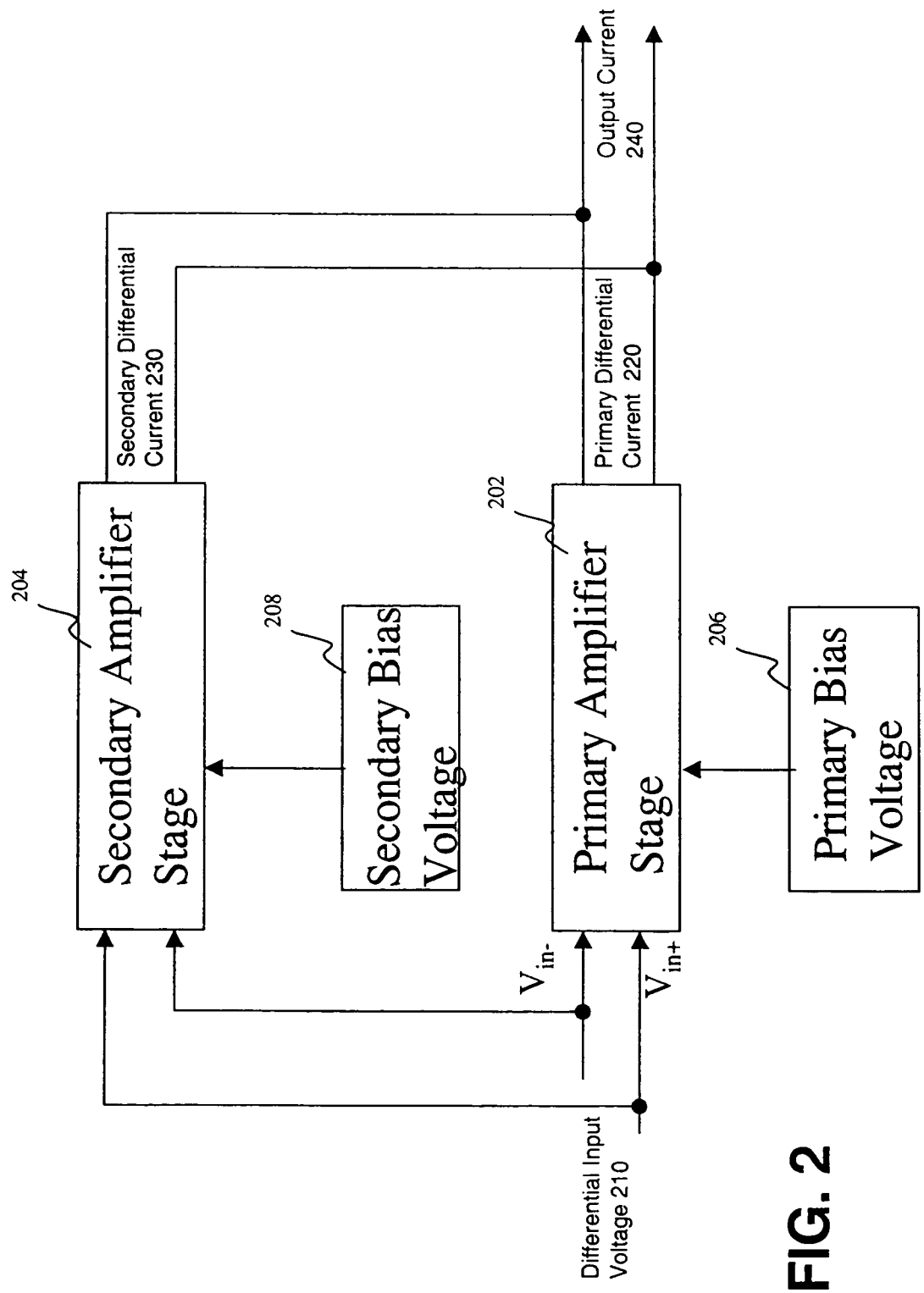
FIG. 2 is a simplified block diagram of the multi-stage variable gain amplifier of FIG. 1 having primary and secondary bias voltages to increase the linearity of the amplifier in accordance with an exemplary embodiment of the present invention.

For example, FIG. 2 illustrates a simplified schematic diagram of an exemplary differential amplifier comprising, by way of example, a primary amplifier stage 202, a secondary amplifier stage 204, a primary bias voltage 206 and a secondary bias voltage 208. The primary amplifier stage 202 and the secondary amplifier stage 204 are coupled to a differential input voltage 210.

In operation, the primary amplifier stage converts the differential input voltage 210 into a primary differential current 220 in accordance with the primary bias voltage 206. Similarly, the secondary amplifier stage 204 converts the differential input voltage 210 into a secondary differential current 230 based on the secondary bias voltage 208. The sum of the primary differential current 220 and the secondary differential current 230 produce an output current 240.

Figure 3:
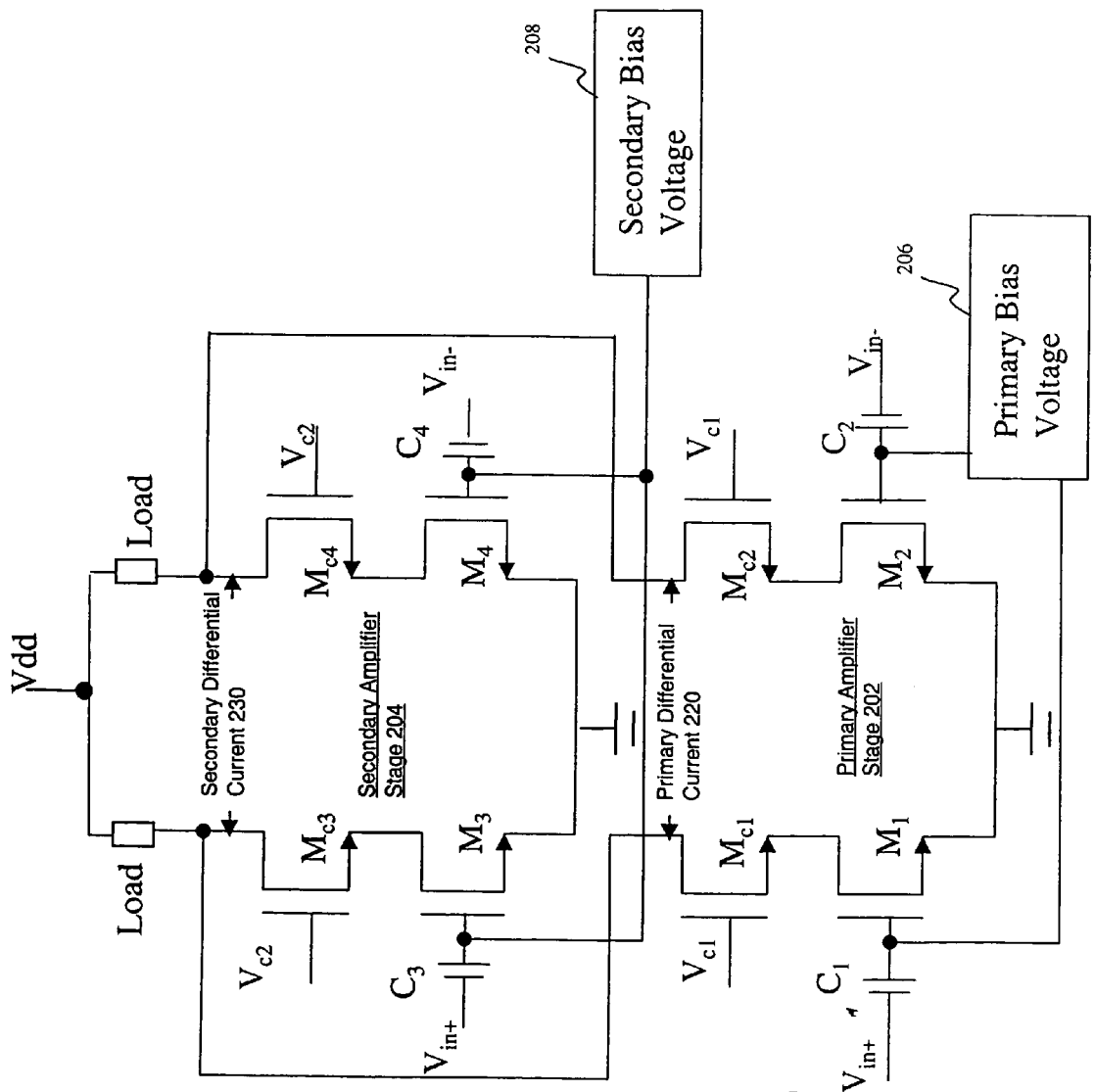
FIG. 3 is a schematic diagram of a differential variable gain amplifier having primary and secondary bias voltages and individually controlled cascode transistors in accordance with an exemplary embodiment of the present invention.

FIG. 3 is simplified schematic diagram of the amplifier of FIG. 2. In the described exemplary embodiment, the primary and secondary amplifier stages comprise cascoded transistor pairs having NMOS FETS (e.g. $M_{c1}$ and $M_1$) serially coupled together such that the source of a cascode transistor (e.g. NMOS FET $M_{c1}$) is coupled to the drain of a transconductance transistor (e.g. NMOS FET $M_1$).

In this embodiment, the differential input voltage is coupled to the transconductance transistors ($M_1$–$M_4$) of the primary and secondary amplifier stages. Further, the cascode transistors ($M_{c1}$–$M_{c4}$) of the primary and secondary amplifier stages are, by way of example, individually coupled to separate cascode control voltages $V_{c1}$ ad $V_{c2}$ respectively. Therefore, the gain of the primary and secondary amplifier stages again can be individually controlled by changing the logic level (i.e. switching between high and low logic level) of the cascode control voltages.

In operation, the primary amplifier stage 202 converts the differential input voltage into a primary differential current 220 as a function of the primary bias voltage 206 when the primary cascode transistors are switched on. In addition, the primary cascode transistors, $M_{c1}$–$M_{c2}$, prevent current flow through the primary transconductance transistors, $M_1$–$M_2$, when the primary cascode transistors are turned off. Similarly, the secondary amplifier stage 204 controls the output current and gain of the secondary amplifier stage. For example, when the secondary cascode transistors, $M_{c3}$–$M_{c4}$, are switched on the secondary amplifier stage current converts the differential input voltage into a secondary differential current 230 in accordance with the level of the secondary bias voltage 208. The sum of the primary differential current 220 and the secondary differential current 230 produce the differential output current.

In an exemplary embodiment of the present invention the primary bias voltage 206 is greater than the secondary bias voltage 208 such that the primary amplifier stage 202 becomes active before the secondary amplifier stage 204 with respect to the magnitude of the differential input voltage. The described exemplary amplifier therefore dynamically adds (or subtracts) the secondary amplifier stage 204 with the primary amplifier stage 202 to obtain a wider and more linear amplifier range.

Figure 4:
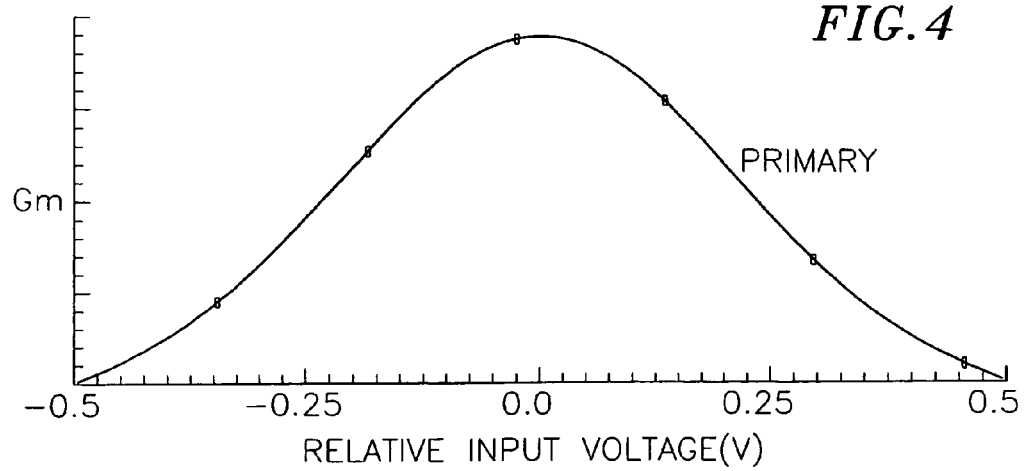
FIG. 4 graphically illustrates the gain versus input voltage characteristic of the primary amplifier stage of the amplifier of FIG. 3 in accordance with an exemplary embodiment of the present invention.
Figure 5:
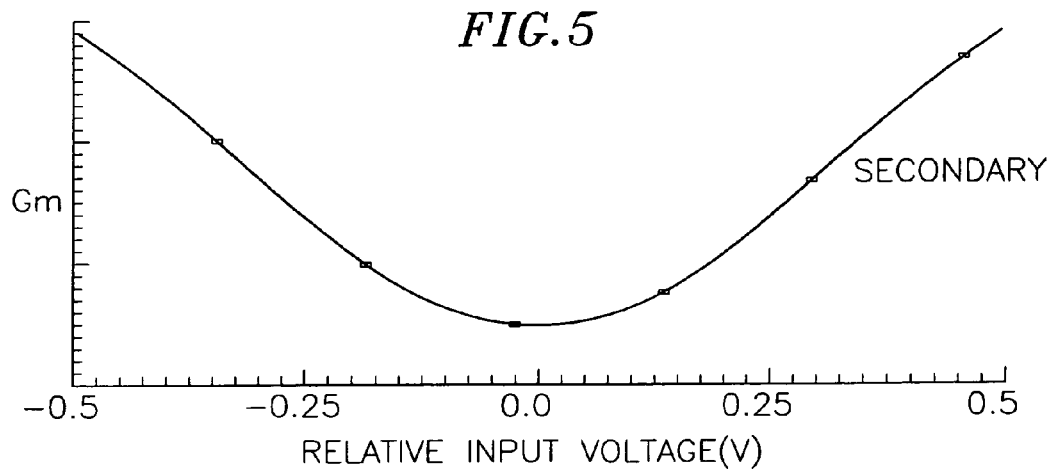
FIG. 5 graphically illustrates the gain versus input voltage characteristic of the secondary amplifier stage of the amplifier of FIG. 3 in accordance with an exemplary embodiment of the present invention.
Figure 6:
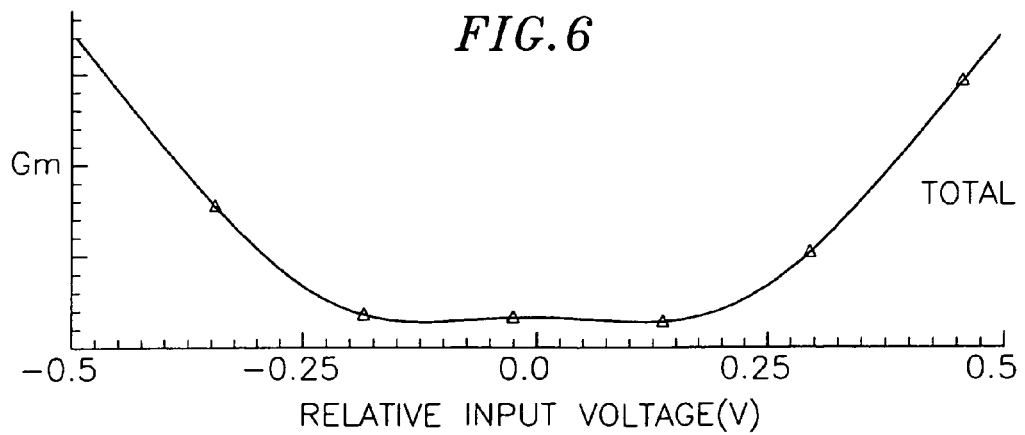
FIG. 6 graphically illustrates the total gain versus input voltage characteristic of the amplifier of FIG. 3 in accordance with an exemplary embodiment of the present invention.

For example, FIGS. 4–6 illustrate the DC values of the transconductance (Gm) of the primary amplifier stage (FIG. 4), the secondary amplifier stage (FIG. 5) and the total transconductance of the exemplary amplifier, as a function of input voltage, when the cascode transistors are switched on. The overall transconductance (FIG. 6) of the amplifier is equal to the sum of the transconductance of the primary amplifier stage and the transconductance of the secondary amplifier stage. When the gate voltages on the transconductance transistors, $M_3$–$M_4$, of the secondary stage have not exceeded their threshold voltage, no secondary differential current is produced. Thus, for relatively low differential input voltages, the output current and transconductance are produced solely by the primary differential current.

As the magnitude of the differential input voltage increases, the secondary amplifier stage becomes active and generates the secondary differential current which is added to the primary differential current. The resulting overall transconductance has a much flatter transfer function than the transfer function of either of the stages independently. In addition, the independent gain control provided by the described exemplary cascode transistors maintains the linearity of the combined primary and secondary gain across a wide gain range.

Figure 7:
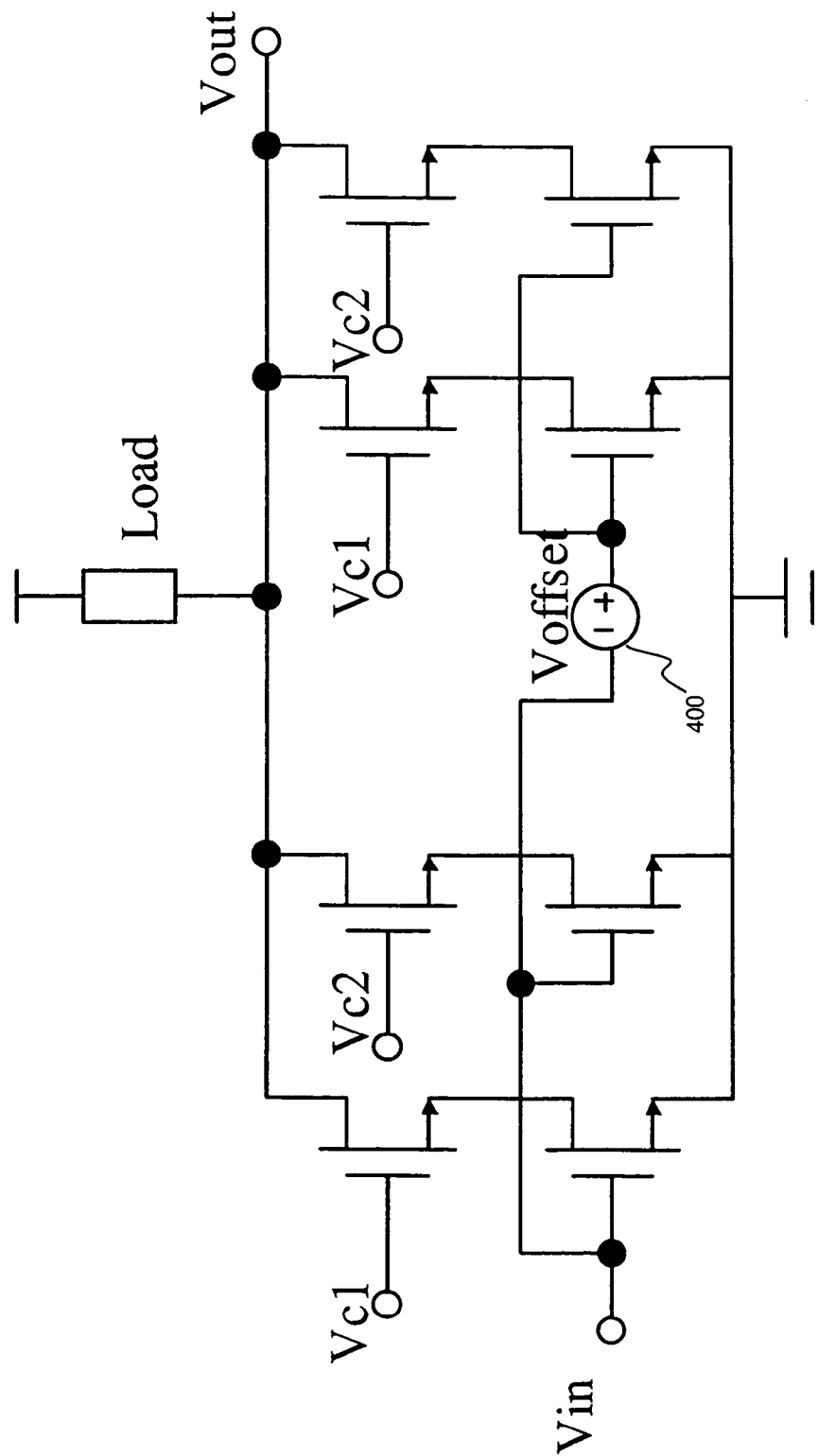
FIG. 7 is a simplified schematic diagram of a single-ended variable gain amplifier having a voltage offset to linearize the transconductance stage and individually controlled cascode transistors in accordance with an exemplary embodiment of the present invention.

One of skill in the art will appreciate that the invention is equally applicable to single-ended or differential implementations. For example, FIG. 7 illustrates a single-ended two stage embodiment including an offset voltage 400 that may add or subtract with the input voltage $V_{in}$ to ensure that the primary and secondary amplifier stages generate a linear transconductance. One of skill in the art will further appreciate that the present invention is not limited to a two stage amplifier. Rather the present invention may be incorporated into an n-stage amplifier design where n is any real number.

Figure 8:
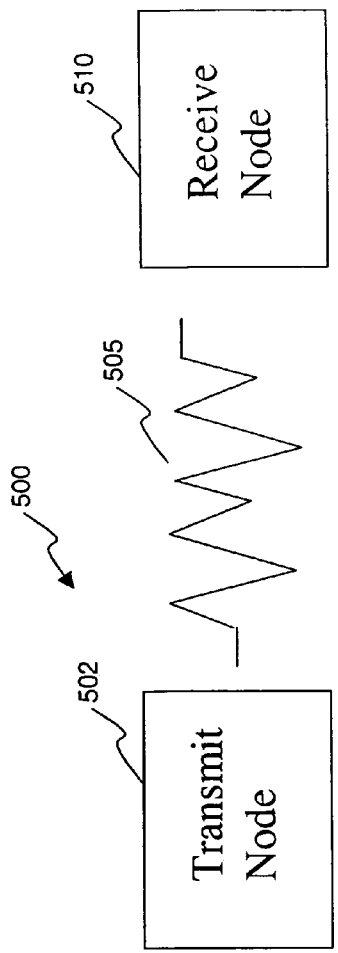
FIG. 8 is a simplified block diagram of a communication system having a transmit node and a receive node.

The described exemplary variable gain amplifier may be integrated into any of a variety of RF circuit applications. For example, referring to FIG. 8, the described exemplary VGA may be incorporated into the transmit node 502 of a typical communication system 500 for transmitting a radio frequency information signal 505 to a receive node 510 that receives and processes the transmitted RF information signal.

Figure 9:
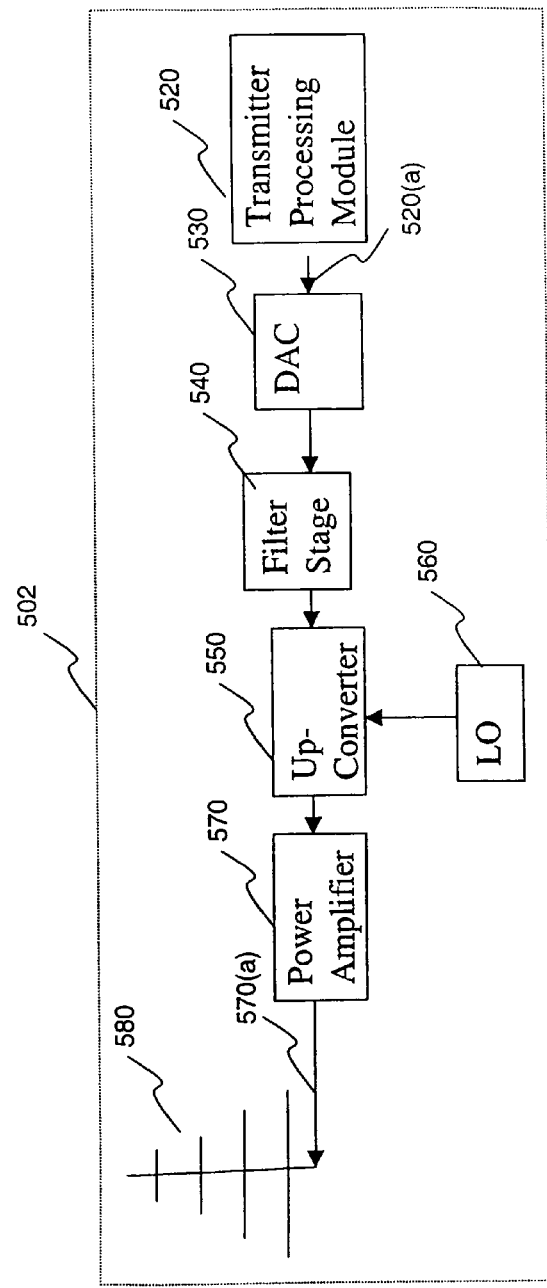
FIG. 9 is a simplified block diagram of the transmit node of FIG. 8 including the variable gain amplifier of FIG. 1 or 3 in accordance with an exemplary embodiment of the present invention.

Referring to FIG. 9, an exemplary transmit node 502 includes, by way of example, a transmitter processing module 520 that receives and processes outbound data in accordance with one or more communication standards, including but not limited to, IEEE 802.11, Bluetooth, advanced mobile phone services (AMPS), global systems for mobile communications (GSM), code division multiple access (CDMA), local multi-point distribution systems (LMDS), multi-channel-multi-point distribution systems (MMDS), and or variations thereof. For example, the transmitter processing module may execute a variety of transmitter functions such as for example, scrambling, encoding, constellation mapping, and modulation to produce digital transmitter data 520(a) formatted in accordance with the appropriate communication standard.

The transmitter processing module may be implemented using a shared processing device, individual processing device, or a plurality of processing devices. For example, the processing module may comprise, a microprocessor, microcontroller, digital signal processor, microcomputer, central processing unit, state machine, or any other device that manipulates signals based upon operational instructions.

In an exemplary embodiment a digital to analog converter (DAC) 530 receives the digital transmitter data from the transmitter processing module and converts the digital transmitter data from the digital domain to the analog domain. The analog transmitter data is a IF or baseband signal typically in the frequency range of one hundred kilohertz to a few megahertz.

The analog transmitter data is forwarded to a filter stage 540 that filters the analog IF or baseband signal to attenuate unwanted out of band signals to produce a filtered IF signal that is coupled to an up-converter 550. The up-converter 550 converts the filtered analog IF or baseband signal into an RF signal based on a transmitter local oscillator signal provided by a local oscillator 560. An exemplary power amplifier 570 as, illustrated in FIGS. 1 and 3 for example, may adjust the gain and amplify the RF signal to produce an outbound RF signal 570(*a*) which is coupled to an antenna 580 for transmission to one or more receiver nodes.

The invention described herein will itself suggest to those skilled in the various arts, alternative embodiments and solutions to other tasks and adaptations for other applications. It is the applicant's intention to cover by claims all such uses of the invention and those changes and modifications that could be made to the embodiments of the invention herein chosen for the purpose of disclosure without departing from the spirit and scope of the invention.

What is claimed is:

1. An RF circuit comprising:
    first means for producing a primary output current from an input voltage as a function of a primary control voltage;
    second means for producing a secondary output current from the input voltage as a function of a secondary control voltage;
    third means coupled to the first means for applying a primary bias voltage to the first means;
    fourth means coupled to the second means for applying a secondary bias voltage coupled to the second means;
    fifth means coupled to the first and second means for summing the primary output current and the secondary output current into an output current of the RF circuit;
    wherein the secondary bias voltage differs from the primary bias voltage.

2. The RF circuit of claim 1, further comprising:
    a first capacitor coupled between the input voltage and the first means; and
    a second capacitor coupled between the input voltage and the second means.

3. The RF circuit of claim 2, wherein the third means is coupled between the first capacitor and the first means, and the fourth means is coupled between the second capacitor and the second means.

4. The RF circuit of claim 1, wherein the first means comprises a primary cascode transistor serially coupled to a primary transconductance transistor, and wherein the primary cascode transistor is coupled to the primary control voltage to control the generation of the primary output current.

5. The RF circuit of claim 4, wherein the second means comprise a secondary cascode transistor serially coupled to a secondary transconductance transistor, and wherein the secondary cascode transistor is coupled to the secondary control voltage to control the generation of the secondary output current.

6. The RF circuit of claim 5, wherein the primary bias voltage is greater than the secondary bias voltage.

7. The RF circuit of claim 5, wherein the third means is coupled to the first means via the primary transconductance transistor, and wherein the fourth means is coupled to the second means via the secondary transconductance transistor.

8. The RF circuit of claim 5, wherein the primary cascode transistor is controlled differently from the secondary cascode transistor.

9. The RF circuit of claim 5, wherein the primary cascode transistor and the secondary cascode transistor are individually switched.

10. The RF circuit of claim 5, wherein the secondary cascode transistor comprises a plurality of cascode transistors each comprising a cascode source and a cascode drain and the secondary transconductance transistor comprises a plurality of transconductance transistors each comprising a transconductance source and a transconductance drain, and wherein the cascode source of each of the plurality of cascode transistors is coupled to the transconductance drain of a corresponding one of the plurality of transconductance transistors.

11. The RF circuit of claim 4, wherein the primary cascode transistor comprises a primary cascode source and a primary cascode drain and the primary transconductance transistor comprises a primary transconductance source and a primary transconductance drain, and wherein the primary cascode source is coupled to the primary transconductance drain.

12. The RF circuit of claim 11, wherein the primary cascode drain is coupled to an inductively compensated output load and the primary transconductance source is coupled to a ground.

13. The RF circuit of claim 4, wherein the primary cascode transistor and the primary transconductance transistor are MOSFETS.

14. The RF circuit of claim 1, wherein the first means activates before the second means.

15. The RF circuit of claim 1, wherein the secondary control voltage differs from the primary control voltage.

16. The RF circuit of claim 1, wherein the primary bias voltage is greater than the secondary bias voltage.

17. The RF circuit of claim 1, wherein the first means comprises a primary amplifier stage, and wherein the second means comprises one or more secondary amplifier stages.

18. The RF circuit of claim 17, wherein the primary amplifier stage activates before the one or more secondary amplifier stages.

19. The RF circuit of claim 1, wherein the first means comprises primary differential cascoded transistor pairs coupled to produce the primary output current in a differential fashion.

20. The RF circuit of claim 19, wherein the second means comprises secondary differential cascoded transistor pairs coupled to produce the secondary output current in a differential fashion.

21. An RF circuit comprising:
    a primary cascoded pair of transistors for producing a primary output current from an input voltage as a function of a primary cascode control voltage;
    a primary capacitor coupled between the input voltage and the primary cascoded pair of transistors;
    a primary bias voltage coupled between the primary capacitor and the primary cascoded pair of transistors;
    a secondary cascoded pair of transistors coupled to the primary cascoded pair of transistors for producing a secondary output current from the input voltage as a function of a secondary cascode control voltage;
    a secondary capacitor coupled between the input voltage and the secondary cascoded pair of transistors; and
    a secondary bias voltage coupled between the secondary capacitor and the secondary cascoded pair of transistors.

22. The RF circuit of claim 21, wherein the secondary bias voltage is less than the primary bias voltage.

* * * * *